(12) United States Patent
Köck et al.

(10) Patent No.: US 10,739,080 B2
(45) Date of Patent: Aug. 11, 2020

(54) USE OF A COMPOSITE MATERIAL FOR HEAT MANAGEMENT

(71) Applicant: SGL CARBON SE, Wiesbaden (DE)

(72) Inventors: Thomas Köck, Meitingen (DE); Werner Langer, Meitingen (DE); Bastian Hudler, Meitingen (DE)

(73) Assignee: SGL CARBON SE, Wiesbaden (DE)

( * ) Notice: Subject to any disclaimer, the term of this patent is extended or adjusted under 35 U.S.C. 154(b) by 0 days.

(21) Appl. No.: 15/740,566

(22) PCT Filed: Jun. 27, 2016

(86) PCT No.: PCT/EP2016/064812
§ 371 (c)(1),
(2) Date: Dec. 28, 2017

(87) PCT Pub. No.: WO2017/001323
PCT Pub. Date: Jan. 5, 2017

(65) Prior Publication Data
US 2018/0187977 A1    Jul. 5, 2018

(30) Foreign Application Priority Data
Jun. 30, 2015    (KR) .......................... 10 2015 212 132

(51) Int. Cl.
*F28D 17/00*    (2006.01)
*F28D 15/02*    (2006.01)
*C09K 5/06*    (2006.01)
*B32B 3/12*    (2006.01)
(Continued)

(52) U.S. Cl.
CPC ................ *F28D 15/02* (2013.01); *B32B 3/12* (2013.01); *C09K 5/063* (2013.01); *F28F 23/00* (2013.01);
(Continued)

(58) Field of Classification Search
CPC ......... H01L 35/34; B22C 9/105; F28D 15/02; B32B 3/12; B32B 2250/03; C09K 5/063; F28F 23/00; F28F 21/02; F28F 21/04; F28F 21/082; F28F 21/084; F28F 21/085; H05K 7/2029
(Continued)

(56) References Cited

U.S. PATENT DOCUMENTS 7,942,018 B2 *   5/2011   Niu .......................... F28D 15/00
                                                                62/434
2003/0054230 A1 *   3/2003   Al-Hallaj ............ H01M 2/1094
                                                                429/120
(Continued)

FOREIGN PATENT DOCUMENTS

DE           1928694 A1       12/1969
DE       202008007790 U1      10/2009
(Continued)

OTHER PUBLICATIONS

International Search Report dated Sep. 13, 2016 of corresponding International application No. PCT/EP2016/064812; 7 pgs.

*Primary Examiner* — Davis D Hwu
(74) *Attorney, Agent, or Firm* — Maier & Maier, PLLC

(57) ABSTRACT

The use of a composite material for heat management in the electrical and/or electronic area, in particular in a car. A grid-like structure filled with a phase change material (PCM), and to a composite material that includes a grid-like structure filled with PCM. The filled grid-like structure being present on a cover layer or between two cover layers.

10 Claims, 1 Drawing Sheet

(51) Int. Cl.
*F28F 23/00* (2006.01)
*F28F 21/02* (2006.01)
*F28F 21/04* (2006.01)
*F28F 21/08* (2006.01)
*H05K 7/20* (2006.01)

(52) U.S. Cl.
CPC ........... *B32B 2250/03* (2013.01); *F28F 21/02* (2013.01); *F28F 21/04* (2013.01); *F28F 21/082* (2013.01); *F28F 21/084* (2013.01); *F28F 21/085* (2013.01); *H05K 7/2029* (2013.01)

(58) Field of Classification Search
USPC .......................................................... 165/10
See application file for complete search history.

(56) References Cited

U.S. PATENT DOCUMENTS

| | | | | |
|---|---|---|---|---|
| 2005/0128449 A1* | 6/2005 | Phillips | ............... | G03F 7/70716 355/53 |
| 2005/0258394 A1 | 11/2005 | Becher et al. | | |
| 2007/0222112 A1 | 9/2007 | Christ et al. | | |
| 2008/0230203 A1* | 9/2008 | Christ | ................ | C09K 5/063 165/10 |
| 2010/0021758 A1* | 1/2010 | Mortensen | .............. | B22C 9/105 428/613 |
| 2013/0264023 A1 | 10/2013 | Hudler et al. | | |
| 2014/0083477 A1* | 3/2014 | Haq | ........................ | H01L 35/34 136/203 |
| 2015/0305172 A1* | 10/2015 | Guarneros Jones | ......................... | H05K 5/0056 361/752 |

FOREIGN PATENT DOCUMENTS

| | | |
|---|---|---|
| DE | 102011052864 A1 | 2/2013 |
| DE | 102012208576 A1 | 11/2013 |
| DE | 102013215255 A1 | 2/2015 |
| DE | 102013215256 A1 | 2/2015 |
| EP | 1598406 A1 | 11/2005 |
| WO | 2008/087032 A1 | 7/2008 |

* cited by examiner

USE OF A COMPOSITE MATERIAL FOR HEAT MANAGEMENT

FIELD

The present invention relates to the use of a composite material for heat management in the electrical and/or electronic field, in particular in the automotive field, having a lattice-like structure which is filled with phase-change material (PCM), and comprising a composite material consisting of a lattice structure which is filled with PCM and said filled lattice structure is located on a top layer or between two top layers.

BACKGROUND

Using electrical and/or electronic components generates heat, which needs to be dissipated in order to prevent the component from overheating and thus to prevent failure of the component.

Using, inter alia, PCMs (latent heat storage materials) to dissipate heat is known, since said materials can both store heat in the form of latent heat and release it again. PCMs are subject to a phase transition when heat is supplied or released. This can for example be a transition from the solid phase into the liquid phase, or vice versa. When heat is supplied to or dissipated from the PCM, when the phase transition point is reached, the temperature remains constant until the material is completely changed. The heat supplied or dissipated during the phase transition which does not cause the material to change temperature is referred to as latent heat.

Possible phase-change materials are, for example, paraffins, waxes, sugar alcohols, alcohols, sugars, polymers, in particular thermoplastic polymers, water, organic acids such as fatty acids, aqueous salt solutions such as salt hydrates, or amides (WO2008087032A1, U.S. Pat. No. 8,580,171B2).

Owing to the fact that the thermal conductivity of most PCMs is rather low, in the range of from 0.3 to 0.4 W/(m·K), the process of heat absorption or heat emission is very slow and thus not industrially relevant in most cases.

The problem of the process of heat absorption or heat release when using PCMs being very slow can be overcome by using a latent heat storage composite material, the PCM being combined with an auxiliary component having high thermal conductivity, such as graphite, in particular expanded graphite. Expanded graphite is particularly well suited as an auxiliary component owing to the high thermal conductivity and additionally has good chemical resistance (U.S. Pat. No. 8,580,171B2, WO2008087032A1).

In order to use a latent heat storage composite material, the PCM must be prevented from leaking out during the transition into the liquid phase. Encapsulating PCM is known. A drawback of this is the difficulty of encapsulating the PCM. This is mainly caused by the PCM undergoing a change in volume of up to 15% during the phase change, thus resulting in a change in dimension in the composite material produced therefrom of more than 5%, as a result of which the encapsulation fails after just a short period of use, on account of the fatigue of the capsule material. DE102013215255A1 overcomes the difficulty of encapsulating a PCM by using an elastomeric matrix. In this case, the PCM is embedded in an elastomeric matrix. However, this results in additional drawbacks. The elastomeric matrix also has a low thermal conductivity and, in addition, no dimensionally stable components can be formed by means of said materials, since the entire complex becomes soft when the compound is melted.

The known PCM/graphite composite materials have the drawback that a relatively high (at least >10 wt. %) binder proportion needs to be used since otherwise the composite material does not have integrity. For a high binder proportion, conductive additive mixtures of at least 20 wt. % need to be admixed, as a result of which the storage capacity is reduced proportionally, but by at least 25%.

SUMMARY

The problem addressed by the invention is therefore that of providing a composite material which can be used for heat management and by means of which the above-mentioned drawbacks of the prior art can be overcome.

The problem is solved by using a composite material for heat management in the electrical and/or electronic field, for example in the automotive field, in a temperature range of up to 600° C., preferably up to 150° C., having a lattice structure which is filled with phase-change material (PCM).

According to the invention, it was recognised that, when using composite materials of this kind, the changes in dimension in all spatial directions, caused by the PCM, could be reduced to less than 5%, in particular 3%, and thus composite materials having low production tolerances could be produced. In addition, in contrast to the use of conductive additives, at less than 15%, the heat capacity is hardly affected by the lattice structure, and the thermal conductivity is even improved by more than 300% in comparison with the pure PCM, owing to directed heat flows caused by continuous regions having high thermal conductivity.

In the context of the present invention, lattice structure is understood to mean a type of perforated structure which consists of threads, cables, wires, metal sheets or the like, which are interconnected such that a gap always remains between the individual nodes/intersections. Dimensions such as height, width, depth and shape of the structure are not restricted. Polygons, in particular quadrilaterals, hexagons (such as honeycombs) or circles are possible shapes. The dimensions of the quadrilaterals are determined by measuring the length and width and are advantageously each from 1 to 40 mm, preferably from 2 to 40 mm, particularly preferably from 3 to 30 mm. The dimensions of the circles are determined by measuring the diameter and are advantageously each from 1 to 40 mm, preferably from 2 to 40 mm, particularly preferably from 3 to 30 mm. The dimensions of the honeycombs are determined according to DIN 29970 (1998-September) and advantageously each have a size of from 1 to 40 mm, preferably from 2 to 40 mm, particularly preferably from 3 to 30 mm.

The lattice structure advantageously consists of metal, ceramic, graphite or any mixtures thereof. As a result, the lattice structure can consist of a mixture of metal and ceramic, metal and graphite, ceramic and graphite or of a mixture of metal, ceramic and graphite.

If the lattice structure consists of metal, this is preferably selected from the group consisting of aluminium, copper or steel. The lattice structure particularly preferably consists of aluminium. If the lattice structure consists of ceramic, this is preferably selected from the group consisting of aluminium nitride, aluminium oxide, silicon carbide or carbon fibre reinforced silicon carbide (C/SiC). The lattice structure particularly preferably consists of C/SiC. If the lattice structure consists of graphite, the graphite is preferably selected from the group consisting of natural graphite, synthetic graphite or expanded graphite. The lattice structure particularly preferably consists of expanded graphite.

In order to produce expanded graphite having a vermicular structure, graphite, such as natural graphite, is usually mixed with an intercalate, for example nitric acid or sulfuric acid, and heat-treated at an increased temperature of from 600° C. to 1200° C., for example (DE10003927A1).

Expanded graphite is a graphite which, in comparison with natural graphite, is expanded for example by a factor of 80 or more in the plane perpendicular to the hexagonal carbon layers. Owing to the expansion, expanded graphite is characterised by excellent formability and good indentability. Expanded graphite can be used in foil form, a foil having a density of from 1.3 to 1.8 g/cm$^3$ preferably being used. A foil having said density range has thermal conductivities of from 300 W/(m·K) to 500 W/(m·K). The thermal conductivity is determined using the Angstrom method ("Angström's Method of Measuring Thermal Conductivity"; Amy L. Lytle; Physics Department, The College of Wooster, Theses).

The lattice structure advantageously has a wall thickness of from 0.01 to 2 mm, preferably from 0.03 to 0.5 mm, particularly preferably from 0.05 to 0.2 mm, since the heat generated by operating the electrical and/or electronic component can thus be removed more quickly and the influence on the heat capacity is still small.

Particularly good results are achieved using a horizontal thickness of the lattice structure of from 0.5 to 50 mm, preferably from 1 to 30 mm, particularly preferably from 2 to 20 mm. The dimensioning of the thickness allows tailored heat management for different electronic and/or electrical components. Electronic components are, for example, laptops, smartphones, LCDs (liquid crystal display screens), LEDs (light-emitting diodes—screens), OLEDs (organic light-emitting diodes—screens), etc. Electrical components are for example power modules, circuit boards, etc.

By using the lattice structure, the composite material is divided into many small regions, each region being encapsulated separately. In event of damage, this significantly reduces the escape of large amounts of PCM. In addition, the lattice structure increases the strength of the composite material by more than 200% and the modulus of elasticity by more than 400%, it being possible to simultaneously lower the binder quantity to at most 2 wt. %. An additional advantage of the lattice structure is that conductive additive admixtures can be omitted and thus the heat capacity is lowered only slightly, but at most by 15%. Owing to the dimensioning of the lattice structure and material of the lattice structure, the thermal conductivity, and thus the transferable heat flow, can be adjusted in a targeted manner. It is also possible to use asymmetrical lattice structures. This makes it possible to provide a PCM lattice composite material that is tailored to the component.

In addition, combining different materials and material thicknesses makes it possible to produce tailored lattice structures which are adapted to the relevant heat sources of the electrical/electronic component and thus maximise heat dissipation and heat capacity in each case.

In particular sugar alcohols, paraffins, waxes, salt hydrates, fatty acids, preferably paraffins, salt hydrates and waxes, may be used as PCM. For example, pentaerythritol, trimethylolethane, erythritol, mannitol, neopentyl glycol and any mixture thereof can be used as sugar alcohols. Saturated hydrocarbons having the general molecular formula $C_nH_{2n+2}$ can be used, where the number n can be between 18 and 32. The molar mass of paraffins of this kind is thus between 275 and 600 grams per mole. For example, calcium chloride hexahydrate, magnesium chloride hexahydrate, lithium nitrate trihydrate and sodium acetate trihydrate can be used as salt hydrates. For example, capric acid, lauric acid, myristic acid, palmitic acid, stearic acid any mixture thereof can be used as fatty acids. For example, calcium chloride hexahydrate, magnesium chloride hexahydrate, lithium nitrate trihydrate and sodium acetate trihydrate can be used as the salt hydrates. The selection of the PCM depends on the particular temperature range of the application.

The preferred range of application of the composite material in the electrical and/or electronic automotive field is in the temperature range of up to 600° C., salt hydrates preferably being used. In the preferred application temperature range of up to 150° C., paraffins and waxes are preferably used. For electronic applications, for example laptops, the preferred application temperature range is up to 100° C., paraffins and waxes preferably being used.

According to an advantageous embodiment, the PCM can be present in a free, bound, encapsulated or microencapsulated form. Plastics materials, for example polymethylmethacrylate, are suitable as the encapsulation material. The encapsulation material forms a plastics shell for the PCM. "Microencapsulated" is understood in this case to mean an encapsulation of ≤5 mm.

According to an advantageous embodiment, the PCM, in the form of microencapsulated particles, has an average particle size of ≤5 mm, preferably from 3 to 100 μm, particularly preferably from 3 to 15 μm. If the particle sizes exceed 5 mm, there is a significant drop in heat input into the capsule itself and the PCM inside the capsule melts only very slowly. This means that often not the entire heat capacity can be used. If the capsule is too small, this results in an unfavourable ratio of PCM to non-active capsule shell, which in turn negatively influences the heat capacity.

In another advantageous embodiment, a binder is in addition added to the PCM, i.e. the lattice structure is filled with PCM and binder.

According to another advantageous embodiment, the binder can be selected from the group consisting of epoxy resins (for example Araldite 2000 (2014)), silicone resins or acrylate resins.

According to yet another advantageous embodiment, the binder proportion is from 2 to 40 wt. %, preferably from 5 to 30 wt. %, particularly preferably from 5 to 10 wt. %. Owing to the low binder proportion, the strength of the composite material can be increased by more than 100% in comparison with the unbound composite material, and the heat capacity is only slightly influenced. In the particularly preferred case, the heat capacity is reduced by only 10%.

In another advantageous embodiment, a conductive additive is in addition added to the PCM or to the PCM and binder. As a result, the thermal conductivity is additionally increased. Depending on the amount of conductive additive, the thermal conductivities can be increased up to 20 W/(m·K).

Said conductive additive is advantageously selected from the group consisting of synthetic graphite, expanded graphite, boron nitride, aluminium or copper. Expanded graphite is particularly preferably used as the conductive additive.

In another advantageous embodiment, the conductive additive proportion is from 0 to 90 wt. %, preferably from 5 to 30 wt. %, particularly preferably from 10 to 20 wt. %. The admixture of a conductive additive increases the thermal conductivity additionally to the lattice structure and allows larger heat flows to be transferred. For a small admixture of up to 10 wt. %, the impact on the heat capacity is still in an acceptable range of less than 10%.

The mixing ratios of PCM, binder and conductive additives can be adjusted as required, the minimum proportion of the binder being 2 wt. % and the minimum proportion of PCM being 60 wt. %. There is no minimum proportion for the conductive additive. The total of said components is always 100 wt. %.

The present invention also relates to a composite material having a lattice structure which is filled with PCM, the filled lattice structure being located on a top layer or between two top layers.

The above embodiments for the lattice structure, the PCMs, the binders and the conductive additives can also be used for said composite material.

The top layers of said composite material according to the invention can be selected from the group consisting of graphite foils, carbon fibre webs, carbon fibre laid scrim, copper foil or aluminium foil, graphite foils preferably being used.

The heat is distributed quickly through the top layers, owing to the good thermal conductivity of graphite, and in addition the filled lattice structure is also encapsulated, which prevents the PCM from leaking out.

In another preferred embodiment, the top layers have a thickness of from 10 μm to 3 mm, preferably from 0.2 to 2 mm, particularly preferably from 0.5 to 1 mm.

In another preferred embodiment, the top layers consist of graphite foils made of expanded graphite having a density of from 1.3 to 1.8 g/cm$^3$.

BRIEF DESCRIPTION OF THE DRAWINGS

In the following, purely by way of example, the present invention is described by way of advantageous embodiments and with reference to the accompanying drawings, in which.

DETAILED DESCRIPTION OF THE DRAWINGS

Figure 1:
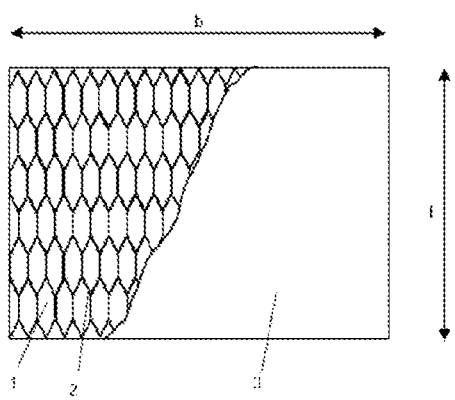
FIG. 1 is a schematic plan view of the PCM/lattice structure composite material according to the second embodiment of the present invention, the surface having been opened in order to illustrate the internal filled lattice structure.

FIG. 1 is a schematic plan view of the second embodiment. The sample size is 95×140 mm (l×b). The lattice structure (2), which consists here of aluminium and in which the PCM material (1) is filled, can be clearly seen. On the bottom and the top, a graphite foil is applied as a top layer (3) in each case.

Figure 2:
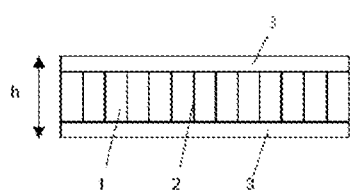
FIG. 2 is a schematic side view according to the second embodiment of the present invention.

FIG. 2 is a schematic side view of the specimen from FIG. 1 according to the second embodiment of the present invention. The thickness (h) of the specimen is 11 mm. It can be clearly seen that the lattice structure (2) filled with PCM (1) is enclosed by the top layers (3) both on the top and on the bottom.

The present invention is described in the following by way of embodiments, the embodiments not limiting the invention in any way.

Embodiment 1

A specimen is produced that has the dimensions 140×95×11 mm. For this purpose, a honeycomb structure consisting of 50 layers of aluminium foils, each having a thickness of 50 μm, is produced by offset point connection using a total of 2 g adhesive (Araldite 2000 (2014)) and subsequent separation. The desired honeycomb height is cut to length from the resulting block. This structure is then filled with 120 g PCM-binder material (100 g Micronal, melting point 28° C. and 20 g Araldite 2000 (2014).

Embodiment 2

A specimen is produced that has the dimensions 140×95×11 mm. For this purpose, a honeycomb structure consisting of 50 layers of aluminium foils, each having a thickness of 50 μm, is produced by offset point connection using a total of 2 g adhesive (Araldite 2000 (2014)) and subsequent separation. The desired honeycomb height is cut to length from the resulting block. This structure is then filled with 120 g PCM-binder material (100 g Micronal, melting point 28° C. and 20 g Araldite 2000 (2014) and clamped between two layers of graphite foil (500 μm thick and 1.8 g/cm$^3$ density).

TABLE 1

| | Reference (without aluminium honeycomb) | Embodiment 1 | Embodiment 2 | Measurement method |
| --- | --- | --- | --- | --- |
| Density [g/cm$^3$] | 0.9 | 0.9 | 0.9 | Measuring and weighing |
| Thermal conductivity [W/(m · K)] | 0.3 | 1.5 | 1.5 | DIN 51908 (2006-05); |
| Bending strength [MPa] | 3.8 | 7 | 9 | DIN 51902 (2009-05) |
| Modulus of elasticity [MPa] | 220 | 900 | 1050 | DIN 51902 (2009-05) |

It has surprisingly been found that, owing to the aluminium honeycomb structure, the thermal conductivity perpendicular to the sample plane, at 1.5 W/(m·K), is significantly higher than for the pure PCM sample (reference sample: composition as per embodiment 1, but without an aluminium honeycomb structure), at 0.3 W/(m·K) (see table 1). If conductive additives were added according to the prior art, at least 30 wt. % thereof would be required in order to achieve the same thermal conductivity, which would, however, reduce the heat capacity of the sample by at least 30%. However, by using the aluminium honeycomb structure, this is reduced only by 15%.

LIST OF REFERENCE SIGNS 1 phase change material
2 lattice structure
3 top layer
b width of the specimen
l length of the specimen
h thickness of the specimen

The invention claimed is:

1. A composite material for heat management in the electrical and/or electronic field, the composite material having a lattice structure which is filled with phase-change material (PCM), wherein
the PCM is present in microencapsulated form with an encapsulation material selected from plastics forming a plastics shell for the PCM, the microencapsulated PCM has a size of ≤5 mm, and the lattice structure divides the composite material into plural regions, each region being filled with the PCM and encapsulated separately by walls of the lattice structure and the lattice structure comprises metal, ceramic or any mixtures thereof or the lattice structure comprises a lattice of expanded graphite in foil form.

2. The composite according to claim 1, wherein the lattice structure has a polygonal structure.

3. The composite according to claim 1, wherein the metal is selected from the group consisting of aluminium, copper and steel.

4. The composite according to claim 1, wherein the lattice structure has a wall thickness of from 0.01 to 2 mm.

5. The composite according to claim 1, wherein the phase change material (PCM) can be selected from the group consisting of sugar alcohols, paraffins, waxes, salt hydrates or fatty acids.

6. The composite according to claim 1, wherein the lattice structure is in addition filled with binder.

7. The composite according to claim 6, wherein the binder is selected from the group consisting of epoxy resins, silicone resins and acrylate resins.

8. The composite according to claim 6, wherein the binder proportion is from 2 to 40 wt. %.

9. A composite material having a lattice structure which is filled with PCM, wherein the filled lattice structure is located on a top layer or between two top layers, and wherein at least one top layer is selected from the group consisting of graphite foils, carbon fibre webs, carbon fibre laid scrim, copper foil and aluminium foil, wherein the PCM is present in microencapsulated form with an encapsulation material selected from plastics forming a plastics shell for the PCM, the microencapsulated PCM has a size of ≤5 mm, and the lattice structure divides the composite material into plural regions, each region being filled with the PCM and encapsulated separately by walls of the lattice structure.

10. The composite material according to claim 9, wherein the top layers have a thickness of from 10 μm to 3 mm.

* * * * *